United States Patent [19]

Davari et al.

[11] Patent Number: 4,621,233

[45] Date of Patent: Nov. 4, 1986

[54] NON-DESTRUCTIVE TESTING OF SEMICONDUCTORS USING ACOUSTIC WAVE METHOD

[75] Inventors: Bijan Davari, Troy; Pankaj Das, Cohoes, both of N.Y.

[73] Assignee: Rensselaer Polytechnic Institute, Troy, N.Y.

[21] Appl. No.: 570,496

[22] Filed: Jan. 13, 1984

[51] Int. Cl.⁴ .................... G01R 31/32; G01R 29/22
[52] U.S. Cl. .................... 324/158 R; 324/56
[58] Field of Search ............. 324/158 R, 56; 73/104, 73/105

[56] References Cited

U.S. PATENT DOCUMENTS 4,286,215  8/1981  Miller ........................... 324/158 R
4,314,393  2/1982  Wakasuki et al. ............. 324/56
4,413,507  11/1983  Drew et al. .................... 73/104

OTHER PUBLICATIONS

Das et al; "Determination of semiconductor. . ."; Applied Physics Letters; vol. 27; No. 3; Aug. 1, 1975; pp. 120-122.
B. Davari and P. Das, IEEE Ultrasonic Symposium Proc., p. 379, (1982)[Published later*].
P. Das et al, Appl. Phy. Letters, vol. 27, No. 3 (Aug. 1975).
P. Das et al, J. Voc. Sci. Technol., vol. 13, No. 4 (Jul.-/Aug. 1976).
P. Das et al, Ultr. Sym. Proc, IEEE, (Sep. 1979).
H. Estrada-Vazquez, J. Appl. Phys, 50(7) (Jul. 1979).
B. Davari et al, J. Appl. Phys. 53(5), (May 1982).
P. Das et al, Appl. Phys Lett. 34(5) (Mar. 1, 1979).
R. T. Webster et al, solid-state Elec, vol. 22, pp. 541-548 (1979).
H. Gilboa et al, IEEE Trans, (Feb. 1980) vol. ED-27, No. 2.
K. Varahramyan et al, J. Appl. Phys 51(2) (Feb. 1980.
M. E. Motamedi et al, J. Appl. Phys, vol. 48, No. 6, (Jun. 1977).
G. L. Miller, IEEE Trans, vol. ED-19, No. 10, (Oct. 1972).
A. Goetzberger et al, J. Appl. Phys, vol. 38, No. 12 (Nov. 1967).
R. A. Moline, J. Appl. Phys, vol. 42, No. 9, Aug.(1971).
E. H. Nicollian et al, IEEE Trans., vol. ED-20, No. 4 (Apr. 1973).
W. C. Johnson et al, IEEE Trans, vol. ed 18, No. 10 (Oct. 1971).
D. P. Kennedy et al, Impurity Dist. in Silicon (Sep. 1968), (Mar. 1969).
P. Das et al, Journal Re Physique (Oct. 1981).
H. Gilboa, RPI (Jul. 2, 1977) (in part).

Primary Examiner—Ernest F. Karlsen
Assistant Examiner—Vinh P. Nguyen
Attorney, Agent, or Firm—McGlew and Tuttle

[57] ABSTRACT

A contactless non-destructive technique for measuring at least one surface property of a first semiconductor material surface utilizes an electrically conductive interdigital transducer and a metal plate defined on a piezoelectric material. The metal plate has a window therein and the semiconductor material is positioned with its first surface over the window and facing the exposed piezoelectric material of the window. A radio frequency pulse is applied to the interdigital transducer to generate a surface acoustic wave on the piezoelectric material. This produces a transverse electric field which extends above the surface of the piezoelectric material and propagates across the window. This field acts as a probing field in the semiconductor material at the surface facing the piezoelectric material, and due to acousto-electric interaction a transverse acousto-electric voltage is produced. A dc voltage is applied to an opposite surface of the semiconductor to change the surface potential of the semiconductor material. A characteristic curve plotting the transverse acoustoelectric voltage against the dc voltage can be utilized to determine various surface properties for the semiconductor material. The window also defines the position where this surface property is measured.

4 Claims, 8 Drawing Figures

NON-DESTRUCTIVE TESTING OF SEMICONDUCTORS USING ACOUSTIC WAVE METHOD

This invention was made with Government support under Contract/Grant No. AFOSR-82-0281 awarded by the U.S. Department of Defense. The Government has certain rights in this invention.

FIELD AND BACKGROUND OF THE INVENTION

The present invention relates in general to techniques and devices for obtaining the surface characteristics of semiconductor materials, and in particular to a new and useful method and apparatus for the non-destructive surface acoustic wave study of semiconductor surface properties.

A non-destructive surface acoustic wave (SAW) technique has been used to study semiconductor surface properties. Surface acoustic waves are generated by applying an rf pulse to interdigital transducers made on the surface of a piezoelectric material ($LiNbO_3$) by evaporation and photolithography. Because $LiNbO_3$ is piezoelectric, the acoustic wave is accompanied by an electric field with a component perpendicular to the surface of the $LiNbO_3$ substrate. This component exists outside the $LiNbO_3$ to a distance of about an acoustic wavelength (about 31.6 $\mu$m for f=110 MHz). The SAW measurement technique relies on the nonlinear interaction between this probing electric field and the free carriers of the semiconductor under study which is placed above the piezoelectric substrate. The penetration depth of the electric field inside the semiconductor is on the order of the semiconductor extrinsic Debye length or the acoustic wavelength, whichever is shorter. As a result of this nonlinear interaction, a transverse acoustoelectric voltage (TAV) develops across the semiconductor.

The TAV amplitude dependence on the electronic properties of the semiconductor surface is proportional to the conductivity difference between the electrons and holes, i.e., $$TAV = V_o \frac{n\mu_n - p\mu_p}{n\mu_n + p\mu_p} \times \frac{1}{w^2 R^2 (1 + e_p/e_s)^2 + (\gamma + e_p/e_s)^2} \quad (1)$$

where:
n,p = free electron and hole concentrations within the interaction depth;
$\mu_n$, $\mu_p$ = electron and hole mobilities;
w = SAW angular frequency;
$e_p$ = permitivity of the piezoelectric substrate;
$e_s$ = permitivity of the semiconductor under study; and $$\gamma^2 = 1 + \frac{w_{cn} w_{Dn} + w_{cp} w_{Dp}}{w^2}; \quad (2)$$

where:

$w_{cn} = \frac{q\mu_n n}{e_s}$, $w_{cp} = \frac{q\mu_p P}{e_x}$, $q$ = electronic charge;

$W_{Dn} = \frac{U_s^w}{D_n}$, $w_{Dp} = \frac{U_s^2}{D_p}$, $U_s$ = SAW velocity;

$D_n$, $D_p$ = electron and hole diffusivity; and $$R = \frac{w_{cn} w_{Dn}^2 + w_{cp} w_{Dp}^2}{(w_{cn} w_{Dn} + w_{cp} w_{Dp})^2} \gamma. \quad (3)$$

The constant $V_o$ in equation (1) is related to temperature, piezoelectric coupling coefficient, frequency, and the acoustic power. Surface properties of the semiconductor can be studied by varying the surface conductivity while monitoring the TAV signal. Surface conductivity can be varied by photons, heating or cooling, and dc voltage applied across the semiconductor.

The photon excitation has been used in the form of one- and two-beam TAV spectroscopy to determine GaAs and CdS surface band structures. The application of dc voltage to study the surface properties of silicon has also been used.

The following is pertinent to the foregoing analysis and this application:

P. Das. M. E. Montamedi, and R. T. Webster, *Appl. Phys. Lett.* 27,120 (1975);

P. Das, M. E. Montamedi, H. Gilboa, and R. T. Webster, *J. Vac. Sci. Technol* 13, 9481 (1976);

H. Gilboa and P. Das; "Nondestructive Evaluation of Electrical Properties of Semiconductors Using SAW," *Technical Report MA-ONR-15*, RPI, Troy, N.Y., July (1977);

P. Das, M. K. Roy, R. T. Webster, and K. Varahramyan, *IEEE Ultrasonic Symposium Proceedings*, p. 278, September (1979);

H. Estrada-Vazquez, R. T. Webster, and P. Das, *J. Apply. Phys.* 50, 4942 (1979);

B. Davari and P. Das, *J. Appl. Phys.* 53, 3668(1982);

B. Davari and P. Das, *Appl. Phys. Lett.* 40,807(1982);

P. Das, R. T. Webster, and B. Davari, *Appl. Phys. Lett.* 34,307(1979); S. M. Sze, *Physics of Semiconductor Devices*, 1st ed. (Wiley, N.Y., 1969), p.425;

R. T. Webster, H. Estrada-Vazquez, P. Das, and R. Bharat, *Solid State Electron*, 22, 541 (1979);

Haim Gilboa and Pankaj K. Das, *IEEE Trans. Electron Devices* ED-27, 461 (1980);

S. K. Ghandi, *The Theory and Practice of Microelectronics* 1st ed. (Wiley, N.Y., 1968), p.418;

A. Many, Y. Goldstein, and N. B. Grover, *Semiconductor Surfaces*, 2nd ed. (North-Holland, N.Y. 1971), p.149;

K. Varahramyan, R. T. Webster and P. Das, *J. Appl. Phys.*, 51,1234 (1980);

M. E. Motamedi and P. Das, *J. Appl. Phys.*, 48, 2135 (1977).

Impurity atom profiling of semiconductors has also been performed by different capacitance-voltage (C-V) techniques such as pulsed C-V, the second harmonic method and the feedback technique. In these methods the measured physical quantity is the width of the approximated depletion layer (W). The majority carrier concentration is evaluated by analyzing the dependency of W on a variable bias voltage as applied across an MOS, p-n or Schottky barrier junction. The impurity concentration profile is then obtained from the majority carrier concentration profile.

References which are pertinent to these techniques are:

W. Van Gelder and E. H. Nicollian, *J. Electrochem. Soc.* 118,138 (1971);

J. Verjans and J. Van Overstraeten, *Solid-State Electron* 18,911 (1975);

G. L. Miller, *IEEE Trans. Electron Devices* ED-19,1103(1972).

A. Goetzberger and E. H. Nicallian, *J. Appl. Phys.*, 38,4582 (1967);

D. P. Kennedy, P. C. Murley and W. Kleinfeld, *IBM J. Res. Develop.* 12,399 (1968)

D. P. Kennedy and R. R. O'Brien, *IBM J. Res. Develop.* 13, 212(1969);

E. H. Nicollian, M. H. Hanes, and J. R. Brown, *IEEE Trans. Electron Dev.*, ED-20, 280 (1973);

W. C. Johnson and P. T. Panousis, *IEEE Trans. Electron Div.*, ED-18, 965 (1971);

G. Baccarani, M. Rudan and G. Sqadina, *Solid-State Electron*, 23, 65 (1980);

R. A. Moline, *J. Appl. Phys.* 42, 3553 (1971); and

B. Davari and P. Das, *IEEE ULTRASONIC SYMPOSIUM PROCEEDINGS*, p.379, (1982).

SUMMARY OF THE INVENTION

According to the present invention, a modified structure is used which permits the monitoring of the TAV amplitude while scanning a dc voltage across the semiconductor to be tested. The surface potential of a semiconductor is varied by the external dc voltage applied across an Al plate which is pressed on the back of the semiconductor and the Al structure (with the interaction window) which is fabricated on the surface of the piezoelectric material (ground path). The TAV versus voltage (TAV-V) measurement is applied to study the surface electronic properties such as the flat-band voltage, zero bias surface condition, and the amount of the oxide charge in doped silicon samples. Low (p=11-16 $\Omega$cm) and high (p$\approx$2800 $\Omega$cm) resistivity samples were tested and the results for the low-resistivity silicon were compared to the C-V data. A theoretical analysis of the TAV-V data is also disclosed. The advantages of the TAV-V technique are the nondestructive nature of the measurement and the greater sensitivity for high-resistivity samples. The disadvantages are more complicated theoretical analysis (as compared to C-V) and the lower sensitivity for low-resistivity samples (p<0.1 $\Omega$cm). The second limitation is greatly reduced by a lock-in detection of the TAV signal, according to the invention.

Accordingly, an object of the present invention is to provide a method of measuring surface properties of a semiconductor material using an interdigital transducer on a piezoelectric material, the ground path having a window therein exposing the piezoelectric material, comprising: placing the semiconductor surface on the window facing the piezoelectric material, applying an rf pulse to the transducer to generate a surface acoustic wave across the window, the surface acoustic wave producing an electric field perpendicular to a plane of the window and generating a transverse acoustoelectric voltage across the semiconductor material, applying a dc voltage across the semiconductor material, to change the surface potential of the surface under study, and determining the amplitude of the transverse acoustoelectric voltage as a function of the applied dc voltage, which transverse acoustoelectric voltage is proportional to the selected surface property.

The invention provides that the measurement can be performed nondestructively without the fabrication of any form of contact to the semiconductor surface. The applicability is enormously enhanced by the fact that the applied dc voltage range is reduced from 1000 volts range to 10 volts range (comparable to C-V) by the new structure on the delay line which eliminates the voltage drop across the LiNbO$_3$. Also the investigation of the surface is spatially limited to the area defined by the interaction window due to localization of the probing electric field in the interaction region. This effect introduces the spatial resolution for characterization of large wafers which was not possible previously.

The various features of novelty which characterizes the invention, are pointed out with particularity in the claims annexed to and forming a part of this disclosure. For a better understanding of the invention, its operating advantages and specific objects attained by it uses, reference is made to the accompanying drawings and descriptive matter in which a preferred embodiment of the invention is illustrated.

DESCRIPTION OF THE PREFERRED EMBODIMENT

Figure 1:
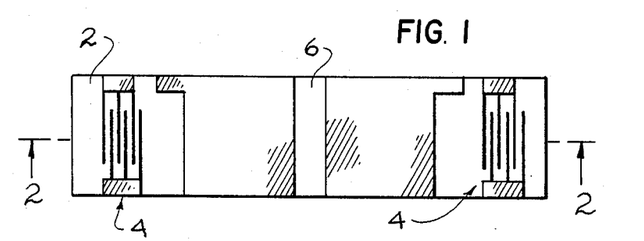
FIG. 1 is a top plan view of a piezoelectric material having an interdigital transducer pattern and the ground path with an interaction window of aluminum disposed thereon.
Figure 2:
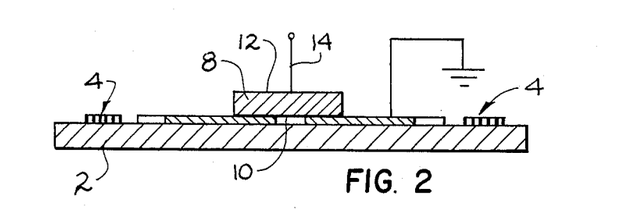
FIG. 2 is a side elevational view of the device shown in FIG. 1, illustrating the position of a sample wafer of semiconductor material to be tested.

Referring to the drawings in particular, the technique of the present invention utilizes a delay line illustrated in FIG. 1 and 2 comprising a piezoelectric material layer 2 having an interdigital transducer pattern 4 and evaporated thin aluminum with a window or interaction region 6. The surface of the piezoelectric material is exposed in window 6.

As shown in FIG. 2, the semiconductor sample or wafer 8 is positioned over the window. A first surface 10 of the sample faces the piezoelectric material and an opposite second surface 12 is adapted for receiving an applied dc voltage.

The piezoelectric material is made of LiNbO$_3$. The material is Y-cut and Z-propagating. Each of the aluminum interdigital transducers has a plurality of interspaced digits which, when activated by an rf pulse, generate a SAW which propagates across the piezoelectric material 2.

As the SAW propagates across the LiNbO$_3$ material, it produces an electric field which is perpendicular to the surface of the material. As a result of nonlinear interaction of this field and the semiconductor rear surface free carriers, a voltage is developed across the semiconductor which is called the transverse acoustoelectric voltage (TAV). This is a dc voltage across the semiconductor which can be monitored by pulsing the rf voltage and thus the perpendicular electric field. As a result of this pulsing, the TAV can be detected as a transient through a capacitive coupling. It is noted that the electric field actually extends above the surface of the LiNbO$_3$ material 2 and projects into the semiconductor material if it is positioned as shown in FIG. 2.

The SAW technique, as used in accordance with the invention, is improved by evaporating a thin aluminum structure on the LiNbO$_3$ material 2, having a thickness on the order of μm. This structure provides a ground path for the TAV signal which does not pass through the piezoelectric substrate material. It is noted that the electric field, as it traverses the aluminum transducer areas, approaches zero while the mechanical wave continues to propagate across this area. Thus, as the mechanical wave reaches the window the probing electric field is regenerated.

In order to change the surface potential, a dc voltage is applied to the sample 8 on a line 14. This voltage V$_{dc}$ is applied to the opposite second surface 12 of the sample.

The nature of the contact between line 14 and semiconductor 8 is also important in performing a non-destructive measurement in accordance with the invention. The back contact is provided by removing any oxide from the back surface 12 and evaporating aluminum with no hot step involved. The same result can be obtained by simply placing an aluminum plate on the back surface 12 which is connected to the line 14. In this case, no evaporation is necessary. The contact surface under study, that is surface 10, is of special importance. This contact is simply provided by placing the sample on the aluminum coated piezoelectric material 2. No other process is necessary.

If placing of the sample or wafer 8 directly on the piezoelectric substrate is not desired, a small air gap can be maintained since the TAV projects from the surface of the piezoelectric substrate by certain distance as noted above. Proper mechanical arrangement (not shown) can provide this small air gap for a contactless measurement.

Figure 3:
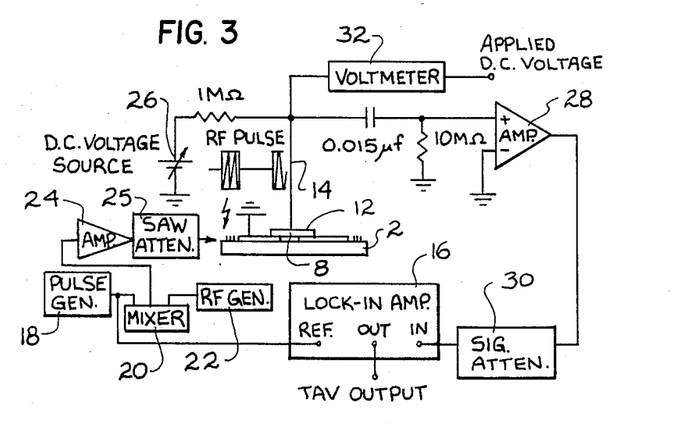
FIG. 3 is a schematic representation of a circuit for activating the device of FIGS. 1 and 2.

The ground path or connection on the surface of the piezoelectric 2 shown in FIG. 2 and 3, reduces the necessary magnitude of the applied dc voltage at 14 by a factor of about 100 as compared to prior attempts at utilizing the TAV. This is due to the elimination of a voltage drop across the piezoelectric material. The range of the external dc voltage needed to change the surface potential within experimental limits (that is going from accumulation to inversion) is reduced from about 1,000 volts to only a few volts which is about the same as that needed in the C-V measurement technique.

According to the invention, and using the circuit of FIG. 3, one of the interdigital transducers 4 is excited by a 110 MHz rf pulse having a 4 ms period. The period of the TAV signal is the same as the rf pulse. The first harmonic of the TAV waveform is directly proportional to the TAV amplitude and this component is monitored by the lock-in amplifier 16 shown in FIG. 3. A reference input is provided by a pulse generator 18.

This is provided to a mixer 20 which is also provided with an rf signal from an rf generator 22. The mixed signal is then applied over an amplifier 24 to an SAW attenuator 25 and ultimately to one of the interdigital transducers 4. The dc voltage is applied by a dc voltage source or means 26 to line 14 which is also connected to a second amplifier 28 connected through a signal attenuator 30 back to the input of lock-in amplifier 16. Line 14 forms one terminal for the dc voltage means, while the ground connection to the aluminum coating or film of the piezoelectric material 2, forms the other terminal.

A voltage meter 32 is provided for measuring the applied dc voltage.

To obtain the TAV-V curves, the amplitude of the TAV signal is recorded as a function of the applied dc voltage measured directly across the semiconductor on meter 32. This is done as the external voltage source 26 is scanned over the desired range. The operation is simple and non-destructive and there is no need to fabricate the MOS structure, as in the prior art.

The TAV-V measurements were performed on the following samples:

(1) Uniformly doped, p-type, boron-duped, (100), p=11–16 Ωcm. This sample is commercially used to fabricate n-channel MOS devices. For testing, an oxide (dry-wet-dry) was grown with a thickness of about 5000 Å.

(2) Uniformly doped, p-type (100), p≈2800 Ωcm. This sample was prepared as a substrate for ion-implanted structures to be tested for doping profile (using TAV-V) in future work. The wet oxide thickness was about 200 Å.

Figure 4:
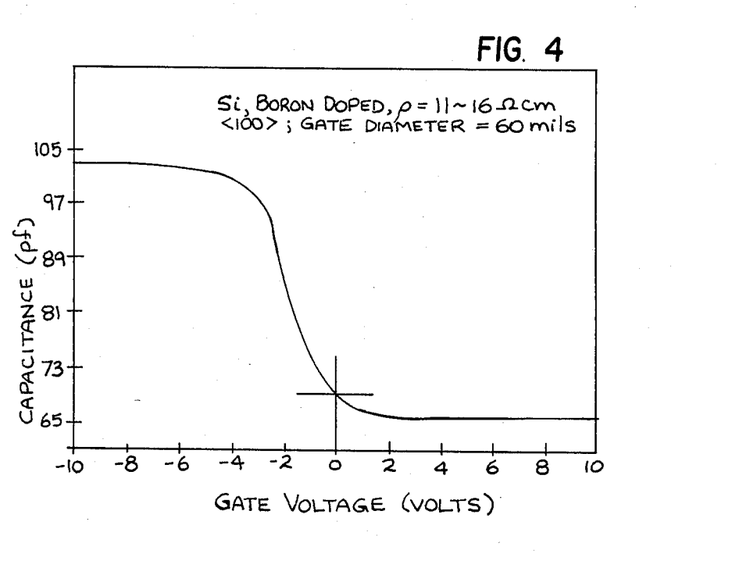
FIG. 4 is a graph showing the gate voltage versus the capacitance of a doped semiconductor.

A C-V plot of an aluminum-gate MOS capacitor fabricated on the same wafer as the first sample (p=11–16 Ωcm) is shown in FIG. 4. It can be observed that at zero gate voltage the surface is strongly depleted with a flat-band voltage (V$_{FB}$) at about −2.5 V. To relate the gate voltage to the surface potential and to estimate the oxide and surface state charges the following equation was used:

$$V_{dc} = -\frac{Q_{sc}}{C_{ox}} - \frac{Q_{sst}}{C_{ox}} + V_s + \phi_{ms}, \quad (4)$$

where:

V$_{dc}$ = gate voltage with respect to substrate (volts);
Q$_{sc}$ = charge per unit area in the semiconductor depletion region (C/cm$^2$);
Q$_{sst}$ = total interface charges (C/cm$^2$);
C$_{ox}$ = oxide capacitance per unit area (F/cm$^2$);
V$_s$ = surface potential (volts); and
$\phi_{ms}$ = work function difference between semiconductor and the gate metal (volts).

Figure 5:
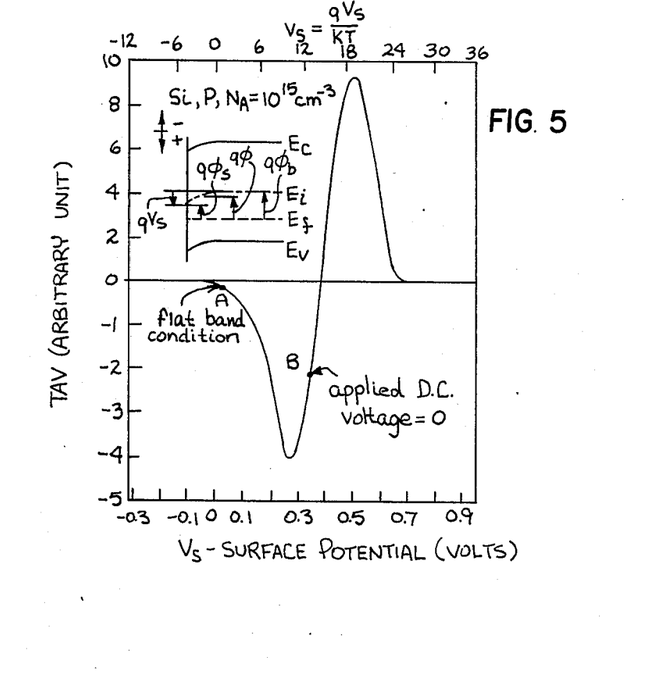
FIG. 5 is a graph showing the surface potential plotted against the transverse acoustoelectric voltage for a semiconductor material.

The energy bands are bent as shown in the inset of FIG. 5. The above parameters are calculated as follows:

$$Q_{sc} = 1.3 \times 10^{-11} F(U_s, U_b) \text{ for Si at 300K}, \quad (5)$$

where:

$$U_s = \frac{KT}{q}\phi_s, \quad U_b = \frac{KT}{q}\phi_b;$$

$\phi_b$ — potential difference between the Fermi level and the intrinsic Fermi level in the bulk; and
$\phi_s$ = the same as $\phi_b$ but at the surface.

$$F(U_s, U_b) = \pm \sqrt{2} \ [(U_b - U_s)\sinh U_b - (\cosh U_b - \cosh U_s)]^{\frac{1}{2}}; \quad (6)$$

$F(U_s, U_b) < 0$ for $U_s > U_b$, $F(U_s, U_b) > 0$ for $U_s < U_b$.

The total interface charge is composed of positive fixed charges in the oxide ($Q_{sso}$) and the surface states charges ($Q_{sss}$).

$$Q_{sst} = Q_{sso} + Q_{sss}. \quad (7)$$

The semiconductor used in the experiment is specified to have low surface state density and the contribution of these charges to the total interface charge is neglected. To evaluate the oxide charge from the flat-band voltage, the value of $-0.7$ V is assumed for the $\phi_{ms}$ between Si (p,p=11-16 $\Omega$cm) and aluminum. In the flat-band condition the surface potential ($V_s$) and the space charge ($Q_{sc}$) are zero and $Q_{sso}$ can be calculated from equation (4) to be about $7 \times 10^{10}$ cm$^{-2}$ ($1.12 \times 10^{-8}$ C/cm$^2$).

Figure 6:
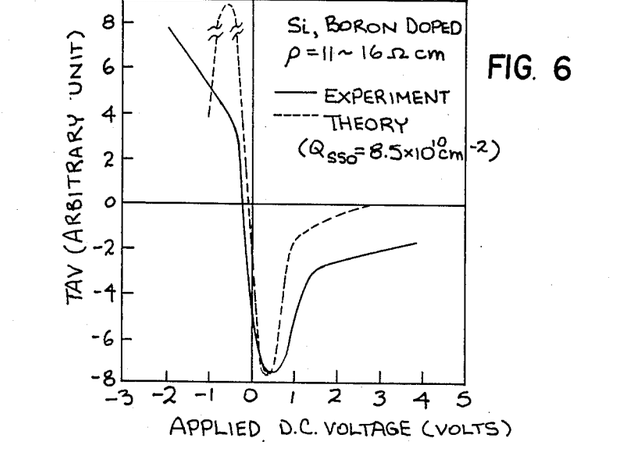
FIG. 6 is a graph showing the applied dc voltage plotted against the transverse acoustoelectric voltage illustrating an experimental and a theoretical relationship between the two.
Figure 7:
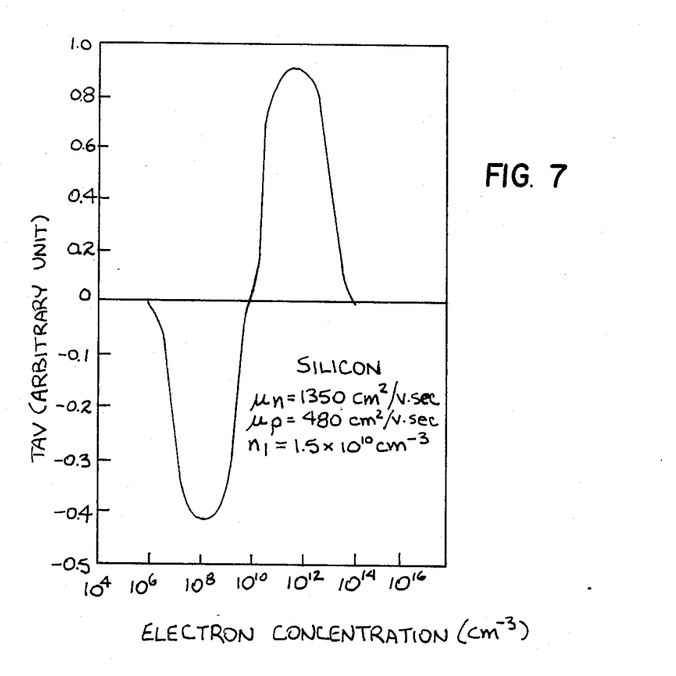
FIG. 7 is a graph showing the electron concentration plotted against the transverse acoustoelectric voltage for silicone.

The same sample (p,p=11-16 $\Omega$cm) was tested using the TAV-V technique. In this method, the MOS structure was simply replaced by positioning the semiconductor on the aluminum window. The TAV-V curve is shown in FIG. 6 (solid line). It should be noted that the polarity of the applied dc voltage in the following experiments was the opposite of the gate voltage applied in the C-V measurements. At zero bias voltage, the TAV amplitude is negative and by increasing the applied dc voltage the TAV curve goes through a minimum. By applying a negative voltage, the TAV amplitude rises sharply and goes through zero towards a positive value. In order to obtain quantitative information from the TAV-V curve, a theoretical analysis of this technique was considered. For this sample (p=11-16 $\Omega$cm) the extrinsic Debye length was $L_e \approx 0.15$ $\mu$m and the penetration depth of the probing electric field was determined by the Debye length. The dependence of the TAV on the conductivity difference between electrons and holes is shown in equation (1). The amplitude and the sign of the TAV depend on the carrier concentration near the surface. For p-type semiconductor, the TAV is negative and for n-type it is positive. For both n- and p-type conductivities, the TAV amplitude goes through a peak as the concentration of the free carriers increases above the intrinsic value as shown in FIG. 7. The qualitative reason is that at a very low carrier concentration there are not enough carriers to interact with the probing electric field and at very high carrier concentration the electric field is practically shielded by the free carriers. The sign of the TAV signal at zero applied voltage indicates the type of the surface conductivity at zero bias. For p-type samples, if the surface is not inverted the TAV is negative and inverting the surface by an applied dc voltage changes TAV polarity to positive. It should be noted that the effect of the drift field parallel to the direction of SAW propagation is neglected. The reason is that the applied dc voltage is transverse and the relative amplitude of the fringing drift field is very small.

To determine the theoretical TAV versus voltage dependence (TAV-V), the following steps are used.

(1) The change in average carrier concentration near the surface as a function of the surface potential ($V_s$) is calculated by:

(a) Determining the change in hole and electron densities ($\Delta_p, \Delta_n$) per unit area as a function of the surface potential, and (b) Estimating the average change in the space charge volume carrier concentration by evaluating the effective space charge width as a function of $V_s$.

(2) The TAV variation as a function of the surface potential is obtained as follows. First, equation (1) is used to calculate the TAV as a function of the surface conductivities of electrons and holes. In deriving equation (1) near flat-band condition is assumed for the interaction between the probing electric field and the surface carriers. Second, the relation between the average surface conductivity and the surface potential, as developed in step (1) is used to relate the TAV to the surface potential. FIG. 5 shows the TAV amplitude as a function of the surface potential for the low resistivity (p=11; 16 $\Omega$cm) sample.

(3) TAV versus the applied dc voltage (TAV-V) is obtained by using the step (2) results and further calculation of the surface potential as a function of the applied dc voltage (equation (4). The theoretical plot of the TAV-V is presented in FIG. 6 (broken line). It should be mentioned that the value of $\phi_{ms}$ was chosen to be zero in the above calculations. The reason is the absence of Al deposition on the surface under study.

The theoretical curve in FIG. 5 shows that at about $V_s = 0.38$ V the TAV was close to zero because the average surface carrier concentration for holes and electrons was close to its intrinsic value. At lower surface potentials the surface was p-type and the TAV was negative. At higher surface potential the minority carriers (electrons) dominate the space charge and the surface became effectively n type and the TAV was positive. By comparing the shape of the experimental TAV-V curve (FIG. 6, solid line) to FIG. 5, one can observe that at zero applied dc voltage the average surface conductivity is still n type but heavily depleted (point B in FIG. 5). The strong depletion is deduced by observing the flat-band condition which is shown as point A in FIG. 5. The positive surface potential was about $V_s = 0.35$ V at zero bias condition. By the application of positive voltage to the back surface of the sample wafer the depletion changes toward accumulation (one should remember that the polarity of this voltage is reversed in C-V measurements) and the TAV curve goes through a minimum (both theoretical and experimental). By applying negative dc voltage the surface inverts and the TAV polarity changes from negative to positive. This analysis demonstrates that the zero bias condition of the surface can be easily diagnosed from the TAV-V curve.

For quantitative analysis the theoretical and experimental TAV-V curves were compared. To obtain the value of the oxide charge ($Q_{sso}$), this parameter was used as a variable in equation (4) to obtain the closest fit between the experimental and theoretical curves (FIG. 6). The oxide charge of about $8.5 \times 10^{10}$ cm$^{-2}$ ($1.36 \times 10^{-8}$ C/cm$^2$) provided the best fit. To obtain the flat-band voltage, equation (4) was used to find the applied dc voltage at which the surface potential is zero. The flat-band potential was found to be about $-2.0$ V. It should be remembered that $\phi_{ms}$ is assumed to be zero because there is no real aluminum deposition on the oxide. The equivalent flat-band voltage when the aluminum is deposited would be $-2.0-0.7=-2.7$ V which is close to the measured value by C-V technique. The values of $Q_{sso}$ and $V_{fb}$ obtained by C-V technique were $1.12\times10^{-8}$ C/cm$^2$, $-2.5$ V, respectively, whereas by the TAV-V technique, they were $1.36\times10^{-8}$ C/cm$^2$ and $-2.7$ V.

There are two reasons for the difference:

The value of $\phi_{ms}$ was assumed to be zero on the TAV-V analysis which might not be accurate since the semiconductor under test was placed above the aluminum window. The true value of $\phi_{ms}$ should be between zero and $-0.7$ V. Since $\phi_{ms}$ and $-Q_{sso}/C_{ox}$ appear as fixed constants in the equation (4), each decrement of $\phi_{ms}$ by $-0.1$ V can decrease the $Q_{sso}$ by $6.0\times10^{-10}$ C/cm$^2$ without changing the relationship between $V_s$ and $V_{dc}$. If $\phi_{ms}$ is assumed to be $-0.2$ V, then the flat-band voltage is $-2.0-0.7-(0.2=-2.5$ V and the $Q_{sso}$ for the best curve fitting is $1.25\times10^{-8}$ C/cm$^2$, which is closer to the C-V measured value.

The second source of uncertainty is the oxide thickness which varies within $\pm100$ Å. This variation can also cause a discrepancy between the theoretical and experimental curves shown in FIG. 6. For thicker oxides the theoretical curve is wider (better fit to experimental curve) due to an increase in the voltage drop across the oxide.

It can be observed in FIG. 6 that in the inversion region (TAV positive) the theoretical curve passes through a maximum as the electron concentration in the inversion region increases. This effect is not observed experimentally. To explain this discrepancy, one should consider the nonlinear interaction between the free carriers in the surface and the probing electric field (f=110 MHz in these experiments). This interaction (which generates the TAV) includes the modulation of the free carrier concentration by the electric field. The response time of the majority carriers to this modulation is on the order of the dielectric relaxation time ($t=e_s/o$ which is about 10 picoseconds for a 10-$\Omega$cm silicon. The response of the minority carriers in the strong inversion region can be much slower. As a result the increase in the minority carrier concentration by the bias voltage does not decrease the TAV as predicted theoretically be essentially considering the same response time for electrons and holes (FIGS. 6 and 5). This effect is somewhat similar to high-frequency C-V measurements where the inversion layer capacitance is not detected.

Due to the finite width of the interaction window of FIG. 1, the surface potential modulation with the applied dc voltage was less effective toward the center of the interaction window. This effect might cause other dissimilarities between the theoretical and experimental curve observed in FIG. 6 (such as the lower experimental TAV amplitude in the strong accumulation region). The effect can be easily eliminated by reducing the width of the interaction window.

Figure 8:
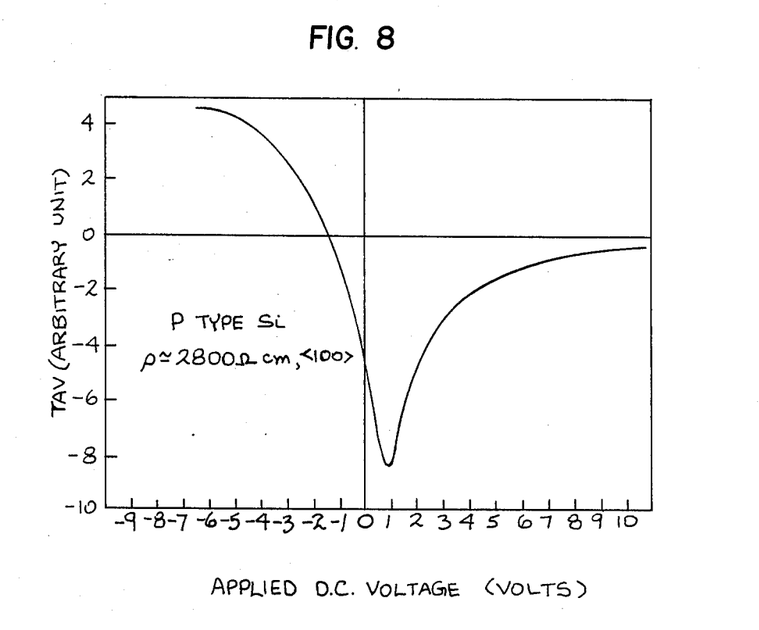
FIG. 8 is a graph showing the applied dc voltage plotted against the transverse acoustoelectric voltage for a P-type silicone semiconductor material.

To show the applicability of the TAV-V technique for high resistivity samples, a p-type substrate with resistivity of about 2800 $\Omega$cm was tested. The result is shown in FIG. 8. From the zero voltage TAV signal it can be deduced that the surface is strongly depleted but not inverted. The surface potential of about $+0.1$ V was estimated at zero applied dc voltage.

While a specific embodiment of the invention has been shown and described in detail to illustrate the application of the principles of the invention, it will be understood that the invention may be embodied otherwise without departing from such principles.

What is claimed is:

1. A contactless method of measuring at least one surface property of a first surface of a semiconductor material using an electrically conductive interdigital transducer and a metal film on the surface of a piezoelectric material, the metal film having a window therein exposing the piezoelectric material surface, comprising:

placing the first surface of the semiconductor material on the metal film having a window therein so that the first surface of the semiconductor material is exposed through the window and is facing the exposed piezoelectric material;

applying an rf pulse to the transducer to generate a surface acoustic wave, the surface acoustic wave producing an electric field perpendicular to the first surface which in turn produces transverse acoustic electric voltage in the semiconductor material adjacent its first surface;

applying a dc voltage between a second surface of the semiconductor material spaced from said first surface thereof, and the metal film on the piezoelectric material which has the window, to change a surface potential of the first surface; and plotting a characteristic curve of the transverse acoustoelectric voltage versus the dc voltage which characteristic curve can be utilized to measure the at least one surface property.

2. A method according to claim 1, including providing a gap between the first surface of the semiconductor material and the window of exposing the piezoelectric material with a gap width at most smaller than a wavelength of the surface acoustic wave propagating across the interdigital transducer and the window.

3. A device for measuring at least one surface property of a first surface of a semiconductor material comprising:

a layer of piezoelectric material having a surface;

an interdigital transducer made of electrically conducting mateial disposed on the surface of the piezoelectric material;

a layer of thin metal film on the surface of the piezoelectric material defining a window exposing at least a portion of the surface of the piezoelectric material, the metal film being out of contact with said transducer;

a wafer of semiconductor material having the first surface for which the at least one surface property is to be measured, disposed over said window with the first surface of the wafer facing the exposed surface of the piezoelectric material, the wafer having a second opposite surface;

a conductive electrode adjacent said second surface of said wafer;

a ground connection connected to said metal film;

an rf pulse generator connected to said interdigital transducer for providing a pulse of rf energy to said interdigital transducer to produce a surface acoustic wave in the piezoelectric material which propagates across said piezoelectric material surface and said window to produce a perpendicular electric field which extends into the first surface of said wafer;

dc voltage means having one terminal connected to ground connection of said metal film on the piezoelectric surface and an other terminal connected to said conductive electrode on the second surface of said wafer for producing a dc voltage to alter a surface potential at the first surface of said wafer;

voltage measuring means connected to said dc voltage means for measuring the dc voltage; and transverse acoustical electric voltage measuring means for measuring the transverse acoustical electrical voltage across the semiconductor wafer.

4. A device according to claim 3, wherein the first surface of said wafer is spaced from said window by a gap having a width which is less than a wavelength of the surface acoustic have propagating across the piezoelectric material.

* * * * *